United States Patent
Saito et al.

(10) Patent No.: US 7,129,727 B2
(45) Date of Patent: Oct. 31, 2006

(54) DEFECT INSPECTING APPARATUS

(75) Inventors: Tsutomu Saito, Hitachinaka (JP);
Osamu Yamada, Hitachinaka (JP);
Eiichi Hazaki, Tsuchiura (JP);
Yasuhiko Nara, Hitachinaka (JP);
Hirofumi Sato, Naka (JP); Yoshikazu Inada, Toride (JP); Yoshinori Numata, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/258,041

(22) Filed: Oct. 26, 2005

(65) Prior Publication Data

US 2006/0087330 A1    Apr. 27, 2006

(30) Foreign Application Priority Data

Oct. 27, 2004 (JP) ............................. 2004-311865

(51) Int. Cl.
*G01R 31/02* (2006.01)
*G01R 31/00* (2006.01)

(52) U.S. Cl. ...................................... 324/754; 324/770
(58) Field of Classification Search ............... None
See application file for complete search history.

(56) References Cited

U.S. PATENT DOCUMENTS

| | | | |
|---|---|---|---|
| 5,309,108 A * | 5/1994 | Maeda et al. | 324/537 |
| 6,198,299 B1 | 3/2001 | Hoffman | |
| 6,225,815 B1 * | 5/2001 | Nakamura | 324/765 |
| 6,252,412 B1 * | 6/2001 | Talbot et al. | 324/750 |
| 6,329,826 B1 * | 12/2001 | Shinada et al. | 324/751 |
| 6,344,750 B1 * | 2/2002 | Lo et al. | 324/751 |
| 6,509,750 B1 * | 1/2003 | Talbot et al. | 324/750 |
| 6,559,663 B1 * | 5/2003 | Shinada et al. | 324/751 |
| 6,566,897 B1 * | 5/2003 | Lo et al. | 324/752 |
| 6,914,441 B1 * | 7/2005 | Talbot et al. | 324/750 |
| 6,946,656 B1 * | 9/2005 | Ezumi et al. | 324/662 |
| 6,952,105 B1 * | 10/2005 | Cheng et al. | 324/751 |
| 6,970,004 B1 * | 11/2005 | Ishitani et al. | 324/752 |
| 2003/0184332 A1 * | 10/2003 | Tomimatsu et al. | 324/756 |
| 2004/0178811 A1 * | 9/2004 | Ishitani et al. | 324/751 |
| 2005/0104614 A1 * | 5/2005 | Sakaguchi et al. | 324/765 |
| 2005/0179452 A1 * | 8/2005 | Brunner et al. | 324/751 |

FOREIGN PATENT DOCUMENTS

| | | |
|---|---|---|
| JP | 9-326425 | 12/1997 |
| JP | 2000-147070 A | 5/2000 |
| JP | 2002-523784 A | 7/2002 |
| WO | WO 00/13030 | 3/2000 |

\* cited by examiner

*Primary Examiner*—Jermele Hollington
(74) *Attorney, Agent, or Firm*—McDermott Will & Emery LLP

(57) ABSTRACT

A defect inspecting apparatus in which a plurality of probes to measure electric characteristics of a sample including a fine wiring pattern are combined with a charged-particle beam unit includes graphic user interfaces (GUI) to simply control the plural probes. The apparatus includes a probe image processing unit to display the plural probes on a display; a selecting unit to select, from the probes displayed on the display, a probe to be operated; and a display unit to simultaneously display the probe selecting unit and information indicating that the selected probe is an operable probe, or the probe is in a non-selected state.

20 Claims, 16 Drawing Sheets

DEFECT INSPECTING APPARATUS

BACKGROUND OF THE INVENTION

The present invention relates to a defect inspecting apparatus for measuring electric characteristics of an electronic element such as a semiconductor chip by use of a fine probe, and in particular, to a defect inspecting apparatus using particularly a charged-particle beam unit for measuring electric characteristics of an electronic element by bringing the probe into direct contact with the electronic element.

To inspect electric defects of a complicated electronic circuit formed on a semiconductor chip, there have been used defect inspecting apparatuses such as an Electron Beam (EB) tester and a prober unit. The EB tester inspects an electrically defective point of a Large-Scale Integrated (LSI) circuit as below. When the tester emits an electron beam onto a measuring point, secondary electrons are emitted from the measuring point. The amount of such emitted secondary electrons varies depending on a voltage value at the point to thereby detect an electrically defective point of the LSI circuit. In the prober unit, a plurality of probe needles disposed according to positions of characteristic measuring pads of an LSI circuit or mechanical probes are brought into contact with the measuring pads and/or plugs to measure electric characteristics of the LSI circuit. When such EB tester or prober unit is employed for the defect inspection, an operator or a user of the apparatus confirms a contact position of each probe through a manual operation while viewing an image of wiring produced by an optical microscope or a Scanning Electron Microscopy (SEM) image generated by a Scanning Electron Microscope (SEM).

Since the circuit pattern formed on a semiconductor element such as an LSI device has been complicated these days, it becomes difficult to quickly move a probe to an optimal position. To overcome the difficulty, there exists a technique called Computer Aided Design (CAD) navigation to reduce the period of time required for moving the probing. That is, in the inspection of a semiconductor device, a wiring layout of the device is displayed in association with an actual image at desired positions on the device, the image being viewed by the operator for the inspection.

To observe the SEM image, a scanning electronic microscope is employed to scan a sample using a primary electron beam to produce a scanned image of a fine pattern sample of a semiconductor. Such apparatus to observe a fine pattern sample includes an image shift function to correctly move an emission area of the primary electron beam or an observing field thereof to an observing point on the sample by use of a deflector including electrically two stages. The deflector electrically deflects the primary electron beam in a range from several micrometers (µm) to about ten µm.

JP-A-2000-147070 describes a probing device including a display section to display a probe information screen indicating information to make a probe achieve a desired operation. The probing device also includes a function to display a sample and the probe in the probe information screen of the display section, to present on the display section a probe operation screen area to move the probe thereto, and to move the probe by a probe controller in response to an operation signal of the probe operation screen area. The probing device further includes a function in which when the operator respectively designates a current position of a tip end of the probe displayed in the probe information screen and a moving target position of the tip end in the probe information screen, the device calculates a moving length or distance from the current position to the target position and makes the probe controller according to the moving distance to move the probe to the target position. The probing device also includes a function to select one of plural probes.

JP-A-9-326425 describes a defect inspecting apparatus including a vacuum chamber, a probing needle and a probing needle moving mechanism to move the probing needle which are disposed in the vacuum chamber, a sample stand to mount a sample thereon, a charged particle source, an emitting unit to emit a charged-particle beam from the charged particle source, a detector to detect charged particles from the sample, a unit to apply a voltage between the probing needle and the sample and/or between the probing needles, and a unit to measure electric characteristics of the sample.

JP-A-2002-523784 describes a probe station to deliver an electric test signal to an integrated circuit as an object to be inspected.

SUMMARY OF THE INVENTION

In recent years, the circuit pattern formed on a semiconductor device such as an LSI device is complex, and the wiring pattern drawn on a semiconductor wafer and positioning or aligning accuracy to bring a tip end of a probe into contact with the wafer are in an order of magnitude of nanometers (nm). In the present stage of art, it is difficult to automatically conduct the alignment of the probe needle with such high accuracy, and hence the operation to bring a tip end of a probe into contact with the wafer is required to be manually conducted. The number of probes necessary for the defect inspection is increasing to reproduce operation of circuits on the semiconductor device. Therefore, the operation of the defect inspecting apparatus using probes is complicated, and it is difficult to move probes to optimal probing positions in a short period of time. Remarkable development and spread of semiconductors today requires increase in the developing speed of new products. To increase yield in the production, it is also required to conduct the defect inspection at a high speed. This results in increase in load imposed on the user of the defect inspecting apparatus to lead contact between probes and a sample. That is, when the number of probes becomes larger, the number of operations to change the magnification ratio in the probe confirmation screen increases in the operation to lead contact between probes and the sample, and for each change of the magnification ratio, it is required that probes are moved to be within a visual field of the screen. There arises a problem that to easily operate the probing device, the user is required to fully become proficient in the operation procedure of the probing unit. To mitigate the load imposed on the user, there has been proposed a probing device in which the user can easily conduct operation to lead the contact between probes and the sample regardless of his or her dexterity and proficiency. However, it cannot be considered that the probing device of the prior art has a device configuration sufficiently mitigating the load imposed on the user.

It is therefore an object of the present invention that the user can easily operate probes in a short period of time in consideration of safety with respect to samples and probes.

The present invention relates to favorably displaying, in a probe operation screen area, an operation environment and a function which are required to lead contact between probes and targets on a sample.

According to the present invention, there is provided a defect inspecting apparatus including a charged-particle source, an emitting unit for emitting a charged-particle beam from the charged-particle source onto a sample, an image shift unit for moving a point on the sample of the charged-particle beam, the beam being emitted onto the point, an image obtaining unit for detecting a beam of secondary charged particles appearing due to the charged-particle beam emitted onto the sample and for obtaining an image of the sample, a display unit for displaying thereon the image obtained in the preceding step, a storage unit having stored information about the sample, an image processing unit for executing image processing on the image to display the image, an electrooptical unit including a communication unit to connect the storage unit to the image processing unit, a sample stage for mounting the sample thereon, a sample chamber including the sample stage therein, a sample change chamber connected to the sample chamber to temporarily keep the sample therein, a first transporting unit for transporting the sample between the sample change chamber and the sample chamber, a probe holder including a plurality of probes which are brought into contact with the sample to measure electric characteristics of the sample, a plurality of probe units for moving the probe holder, a probe holder change chamber for temporarily keeping the probe holder therein, a second transporting unit connected to the sample chamber for transporting the probe holder between the probe holder change chamber and the sample chamber, a base stage for transporting the sample and the probe units to a position at which the sample and each of the probe units can be changed, a probe image processing unit for displaying the plural probes on the display unit, a probe selecting unit for selecting, from the plural probes displayed on the display unit, a probe to be operated, and a probe display unit for simultaneously displaying thereon that the probe selected by the probe selecting unit is a probe which can be operated and that the probe is a probe in a non-selection state in which the probe is not selected.

The defect inspecting apparatus favorably includes a probe driving unit for moving the probe holder. The sample stage, the probe holder, and the probe driving unit are mounted on the base stage to thereby move the sample and the probes in an independent manner and at the same time.

Favorably, the present invention relates to an apparatus including a plurality of probes for measuring electric characteristics of a sample having a fine circuit wiring pattern formed on a semiconductor wafer and fundamentally relates to a defect inspecting apparatus including a display section for displaying a probe information screen to make probes conduct desired operations according to necessity. The apparatus is configured to include functions as below. The probe information screen displays a sample and probes, a probe operation screen area to move probes, and a charged-particle beam operation screen area to control a charged-particle beam. There is provided a function in which a probe control section moves probes in response to an operation signal in the probe operation screen area. The defect inspecting apparatus includes a unit to display contours of probes in a controllable state in the probe information screen, a unit to make the probe display follow a rotation of the display screen by a rotation function, and a unit to magnify or minimize, in response to a change in the display magnification ratio of an electrooptical system, the contours of the probe display according to the display magnification ratio. The apparatus also includes a function which enables, even when controllable probes are absent from the probe information screen, the user to visually determine size of each of the probes and an entering direction of the probe to enter the probe information screen.

The user who operates the defect inspecting apparatus can easily operate probes in a short period of time only by conducting operation in the probe operation screen area. There can also be provided a defect inspecting apparatus in which the user can easily operate probes in a short period of time in consideration of safety with respect to samples and probes.

In a defect inspecting apparatus in which probes are combined with a charged-particle beam device, availability and operability of the apparatus for the user is remarkably improved.

A defect inspecting apparatus according to the present invention includes a charged-particle source, an emitting unit for emitting a charged-particle beam from the charged-particle source onto a sample, an image shift unit for moving a point on the sample of the charged-particle beam, the beam being emitted onto the point, an image obtaining unit for detecting a beam of secondary charged particles appearing due to the charged-particle beam emitted onto the sample and for obtaining an image of the sample, a display unit for displaying thereon the image obtained in the preceding step, a storage unit having stored information about the sample, an image processing unit for executing image processing on the image to display the image, an electrooptical unit including a communication unit to connect the storage unit to the image processing unit, a sample stage for mounting the sample thereon, a sample chamber including the sample stage therein, a sample change chamber connected to the sample chamber to temporarily keep the sample therein, a first transporting unit for transporting the sample between the sample change chamber and the sample chamber, a probe holder including a plurality of probes which are brought into contact with the sample to measure electric characteristics of the sample, a plurality of probe units for moving the probe holder, a probe holder change chamber for temporarily keeping the probe holder therein, a second transporting unit connected to the sample chamber for transporting the probe holder between the probe holder change chamber and the sample chamber, and a base stage for transporting the sample and the probe units to a position at which the sample and each of the probe units can be changed.

The defect inspection apparatus further includes a probe image processing unit for displaying the plural probes on the display unit and a sample information image processing unit for displaying on the display unit an image of information of the sample.

The defect inspection apparatus further includes a probe selecting unit for selecting, from the plural probes displayed on the display unit, a probe to be operated, and a probe display unit for simultaneously displaying thereon that the probe selected by the probe selecting unit is a probe which can be operated and that the probe is a probe in a non-selection state in which the probe is not selected.

In the defect inspecting apparatus, an image obtained by the image processing unit and the plural images of probes are displayed on the display unit by the probe image processing unit at the same time, and a probe to be moved toward or retracted from the image obtained by the image processing unit is selected from the plural probes by the probe selecting unit.

The defect inspecting apparatus further includes a sample information image processing unit for displaying information of the sample as an image on the display unit. The image of the information of the sample and the plural images of probes are displayed on the display unit by the probe image processing unit at the same time. A probe to be moved toward or retracted from the image of the information of the sample is selected from the plural probes by the probe selecting unit.

The defect inspecting apparatus displays the obtained image and the image of the information of the sample on the display unit in an overlapped manner.

The defect inspecting apparatus further includes a display rotating unit for rotating a display image on the display unit displaying the plural probes and the selected probes selected by the probe selecting unit.

DESCRIPTION OF THE EMBODIMENTS

Figure 1:
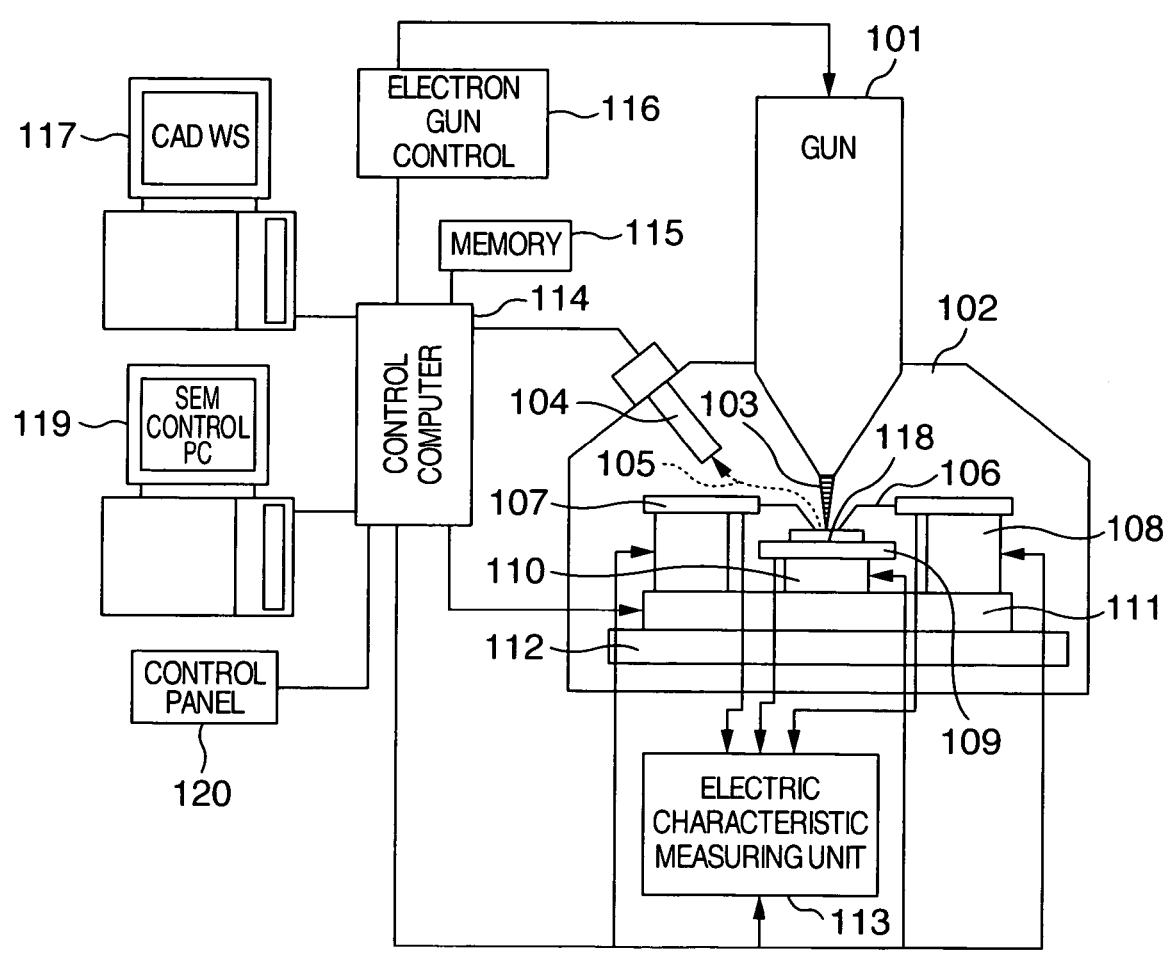
FIG. 1 shows a cross-sectional view partially showing a configuration example of a defect inspecting apparatus of the present invention.

Description will now be given of an embodiment by referring to the drawings. FIG. 1 shows an example of a configuration of a defect inspecting apparatus as an embodiment of the present invention.

A numeral 101 indicates an element of an SEM electronic optical system forming a light emitting optical system to emit a primary electron beam 103 onto a sample to scan the sample with the beam 103. That is, an electron gun 101 of the embodiment indicates a system including substantially all constituent components required for an SEM such as an electron source to generated an electron beam, a deflecting unit to conduct the scanning, and a lens to focus the electron beam. A numeral 102 is a vacuum chamber partition wall to separate an atmospheric area from a vacuum area. Operation of the element 101, specifically, an electron beam drawing voltage of the electron source, currents to the deflecting unit and the lens and the like are controlled by an electrooptical system control unit 116.

As a result of emission of the primary electron beam 103 onto an inspection sample (sample), a secondary electron beam 105 generated from the sample is detected by a secondary electron detector 104. Although a sensor section of the detector 104 is installed within the vacuum chamber partition wall 102, a fundamental section of the sensor section to which, for example, wiring to connect a power source is connected is projected into a space outside the partition wall. A numeral 106 indicates mechanical probes (probes) to be brought into contact with a predetermined area of the sample, and the probes are held by an attachment as a probe holder. A numeral 108 is a probe driving unit to move the probe attachment 107 to a desired position, specifically, to move the attachment 107 on which probes 106 are attached to the desired position.

The sample as an actual object of the defect inspection is held on a sample stand 109. The stand 109 is further held by a sample stand driving unit 110. The stand 109 and the unit 110 are collectively called a sample stage. The sample stage and the probe driving unit 108 are configured on a main stage 111. The main stage 111 includes a driving unit in X and Y directions (in a plane) and a driving unit in Z (perpendicular) direction to drive the sample stage and the probe driving unit 108 as a single unit. In this way, the sample stage and the probe driving unit 108 are configured in a single unit on the main stage 11 in the embodiment. The defect inspecting apparatus is configured to move the sample 118 and the mechanical probes 106 in an independent fashion and as one unit at the same time. The main stage 111 is further arranged on a base 112.

The sample stand 109 and the attachment 107 are connected to an electric characteristic measuring unit 113. The measuring unit 113 primarily measures a current-voltage characteristic detected by the mechanical probes 106 to calculate a desired characteristic value using the current-voltage characteristic. The desired characteristic value is, for example, a value of resistance, a current, or a voltage at a contact position of an associated mechanical probe 6. To analyze a semiconductor wafer, the measuring unit 113 is, for example, a semiconductor parameter analyzer. The reason to connect the unit 113 to the sample stand 109 is that a power feeding plug is disposed, depending on cases, on a surface of the sample stand 109 on which the sample is mounted.

The characteristic value measured by the measuring unit 113 is sent via a transmission line to a control computer 114. The computer 114 conducts a higher-level analysis using the information of the characteristic value. For example, the computer 114 analyzes the value to determine whether or not the measuring position is normal. For the computer 114, a storage unit such as an optical disk, a hard disk, or a memory is disposed to store the electric characteristic measured by the measuring unit 113. The computer 114 also controls the overall operation of the defect inspecting apparatus. For example, the computer 114 controls operations of constituent components such as the electron gun controller (electrooptical control unit) 116, the secondary electron detector 104, the probe driving unit 108, and the main stage 111 with a sample unit.

For this purpose, the control computer 114 includes a memory 115 to store software to control constituent components connected thereto and an input unit for the user to input setting parameters for to set associated devices. The input unit includes, for example, a keyboard and a mouse to move a pointer on a screen for desired operation. Data of a wiring layout of a sample to be inspected (to be referred to as CAD image data) is stored in a CAD workstation (WS) 117. The workstation includes an image display unit to display the wiring layout. The workstation is connected to the computer 114 to deliver the CAD image data to the computer 114 according to necessity. A numeral 118 indicates an inspection sample to be inspected.

An SEM control PC 119 conducts, in response to a PC or WS GUI operation or a command input, operations to control SEM items such as an optical condition, a magnification ratio, a focus, an image shift, brightness of an SEM image, a scan speed, alignment, recording of an image, and movement of a stage/probe. A control panel 120 conducts part of the function of the SEM control PC 119 by operating the mechanical probes 106, the sample unit, and the main stage 111 using a joystick, a button, or the like. For the personal computer 119, a workstation may be naturally employed.

Figure 2:
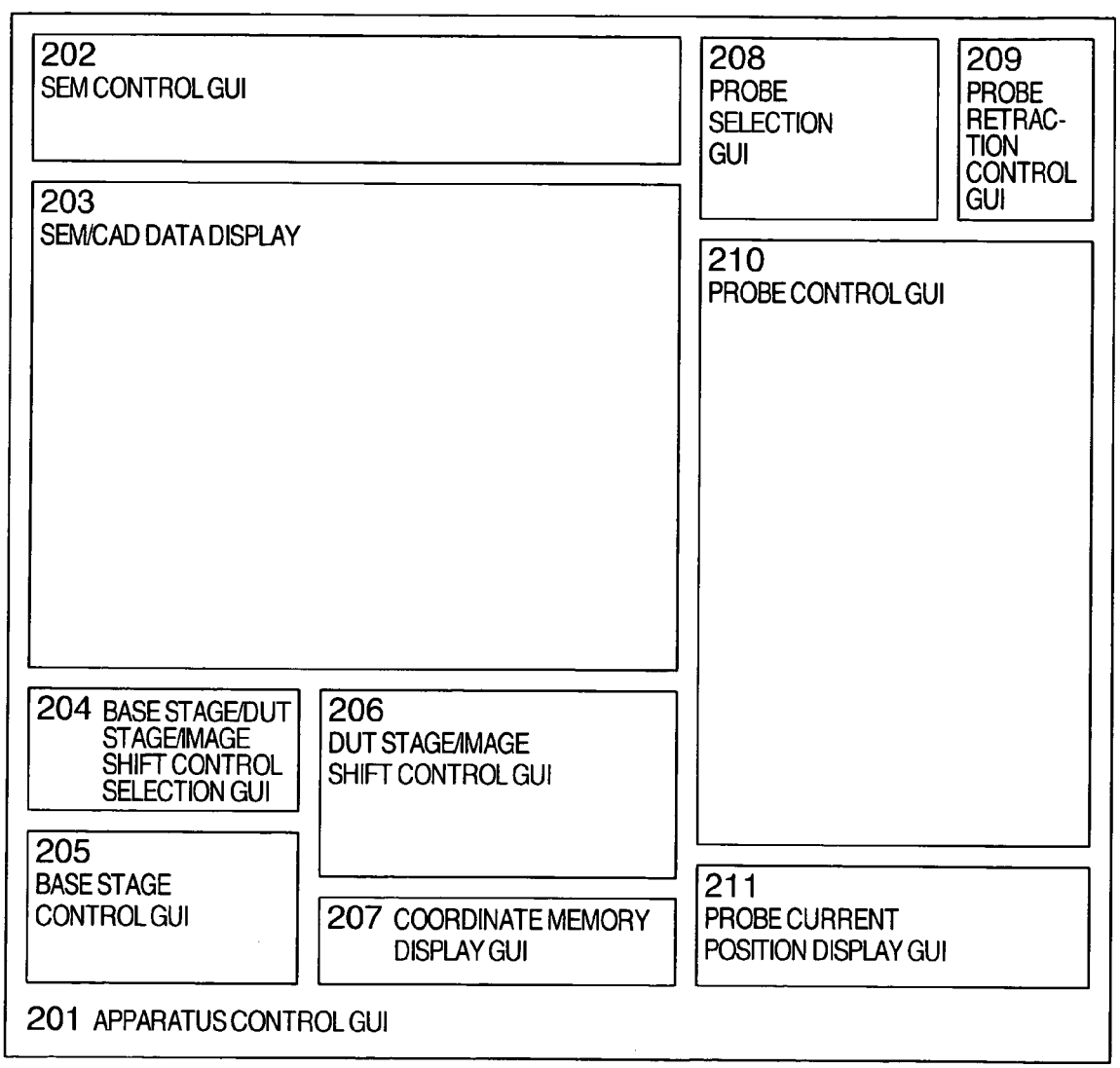
FIG. 2 shows a diagram showing a Graphic User Interface (GUI) of an SEM control Personal Computer (PC) of the defect inspecting apparatus.

Referring next to FIG. 2, description will be given of an example of GUI displayed on the PC 119 of the defect inspecting apparatus of FIG. 1, namely, on the SEM•probe•stage control PC 119. An SEM•probe•stage control GUI 201 mainly includes eleven fields. An SEM control GUI field 202 includes, to control an SEM image displayed on an SEM image/CAD data display field 203, icons and menus to set an SEM optical condition, an SEM magnification ratio, a focus, an image shift, brightness of an SEM image, a scan speed, alignment, recording of an image, and the like. A base stage/DUT (Device Under Test) stage/image shift control GUI 204 includes icons to select either one of a base stage, a DUT stage, and an image shift to move the item thus selected and an icon to lock either one thereof such that the item thus selected is not moved. A base stage control GUI field 205 includes icons to move the main stage 111 to a central position, a charge-coupled device (CCD) observing position, and a mechanical probe change position; an icon to remove backlash, and a coordinate input•display box. A DUT stage/image shift control GUI field 206 includes, for example, a cross cursor to indicate a moving position, an arrow icon, a combo box to select a moving length, a coordinate input•display box, and a reset button to return control to an image shift central point. A coordinate memory display GUI field 207 includes icons to register coordinates of the main stage, the sample stage, and the image shift; a combo box to select/call registered coordinates, and a registered coordinates display box. A probe selection GUI field 208 includes icons to display "selection or nonselection" and "display or nondisplay" for a probe unit desired to be driven. A probe retraction control GUI 209 includes an icon to retract all probes. A probe control GUI field 210 to control driving of the mechanical probes 106 includes a scroll bar and an arrow icon to control driving of the probe in the X, Y, and Z directions using a mouse, a scroll bar to conduct fine adjustment of the Z-directional driving by use of a mouse, a reset icon to restore the globe position in the X, Y, Z directions to a central point, a combo box to select a speed to inch the probe in the X, Y, Z directions, a combo box to select a step length to inch the probe in the X, Y, Z directions, and a combo box to select a speed to sequentially move the probe in the X, Y, Z directions. A globe position display GUI field 211 includes a display field of a current positional state of each probe.

Although the respective GUI fields are arranged on the GUI in FIG. 2, the GUI fields may be replaced with each other to help the user easily conduct observation and operation described above.

Figure 3A:
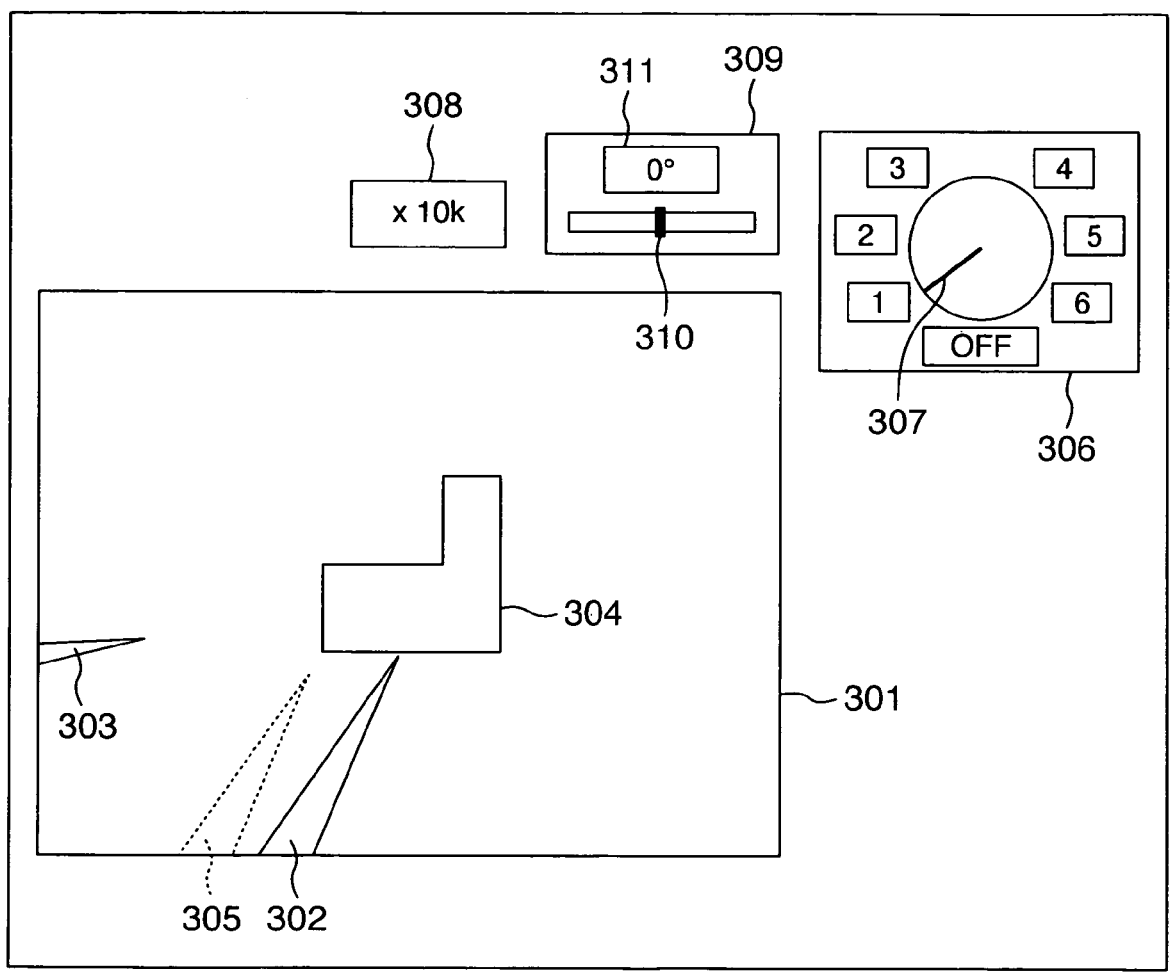
FIGS. 3A–3D show diagrams respectively showing a probe display GUI of the SEM control PC of the defect inspecting apparatus.

Next, referring to FIGS. 3A to 3D, description will be given of a display example, on the SEM•probe•stage control GUI 201, of an SEM image and probes selected as above. The example of FIG. 3A shows a state to control probe no. 1. The SEM and GUI display conditions are designated as 10000 (10 k) for the SEM display magnification ratio and 0 degree (0°) for the rotation angle. Probes no. 1 and no. 2 are moved to approach an SEM display object. Under the conditions, a probe no. 1 302, probe no. 2 303, a SEM display object 304, and a no. 1 display GUI field 305 are displayed in the SEM display screen (GUI) 301 (corresponding to the SEM/CAD data display field 203 of FIG. 2). A selection control dial GUI field 307 of a probe selection GUI field 306 indicates a position of probe no. 1, and a magnification ratio display GUI field 308 displays 10000, i.e., 10 k. In a rotation display GUI field 309, a rotation adjusting knob GUI field 310 and a rotation angle display GUI field 311 indicates 0 degree (0°). The no. 1 display GUI field 305 indicates that probe no. 1 is a probe selected by a probe selecting unit. This means that probe no. 1 is a controllable probe to be moved toward the SEM display object (SEM image) or to be retracted to apart therefrom. This may be conducted in another method, for example, such selected probe is visually indicated or is indicated using a particular color.

Figure 3B:
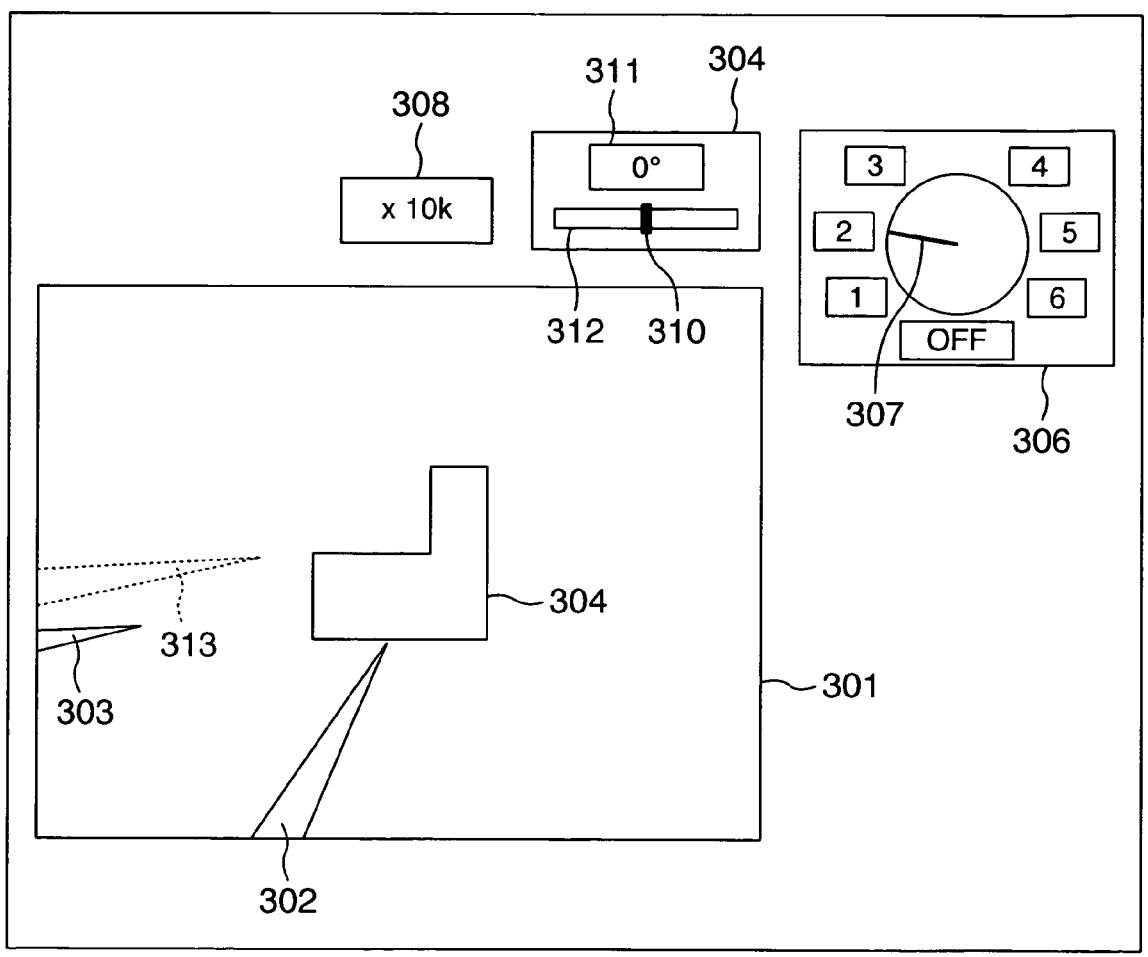

Next, FIG. 3B shows an example of a state of the GUI 301 when the state of FIG. 3A is changed to control probe no. 2. The SEM display screen displays a probe no. 2 display GUI field 313 in place of the no. 1 display GUI field 305. The selection dial GUI field 307 of the probe selection GUI field 306 indicates a position 313 of probe no. 2.

Figure 3C:
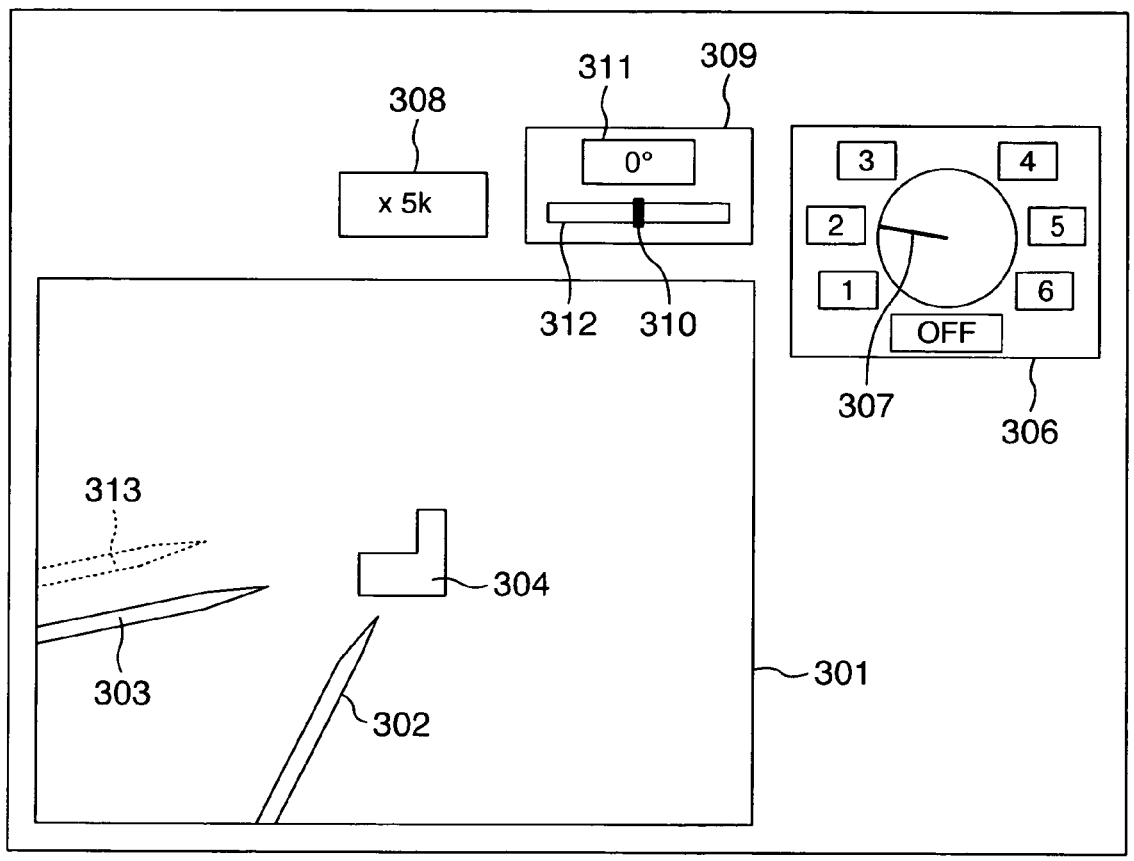

FIG. 3C shows an example of a state of the GUI 301 when the state or FIG. 3B is changed to set the SEM display magnification ratio to 5000 (5 k). As a result of the magnification ratio change, the SEM display screen displays a wider-range image such that the probe no. 1 302, the probe no. 2 302, the probe no. 2 display GUI field 313, and the SEM display object 304 are displayed with a magnification ratio of 5000. Simultaneously, the magnification ratio display GUI field 308 is changed to indicate 5000, i.e., 5 k.

Figure 3D:
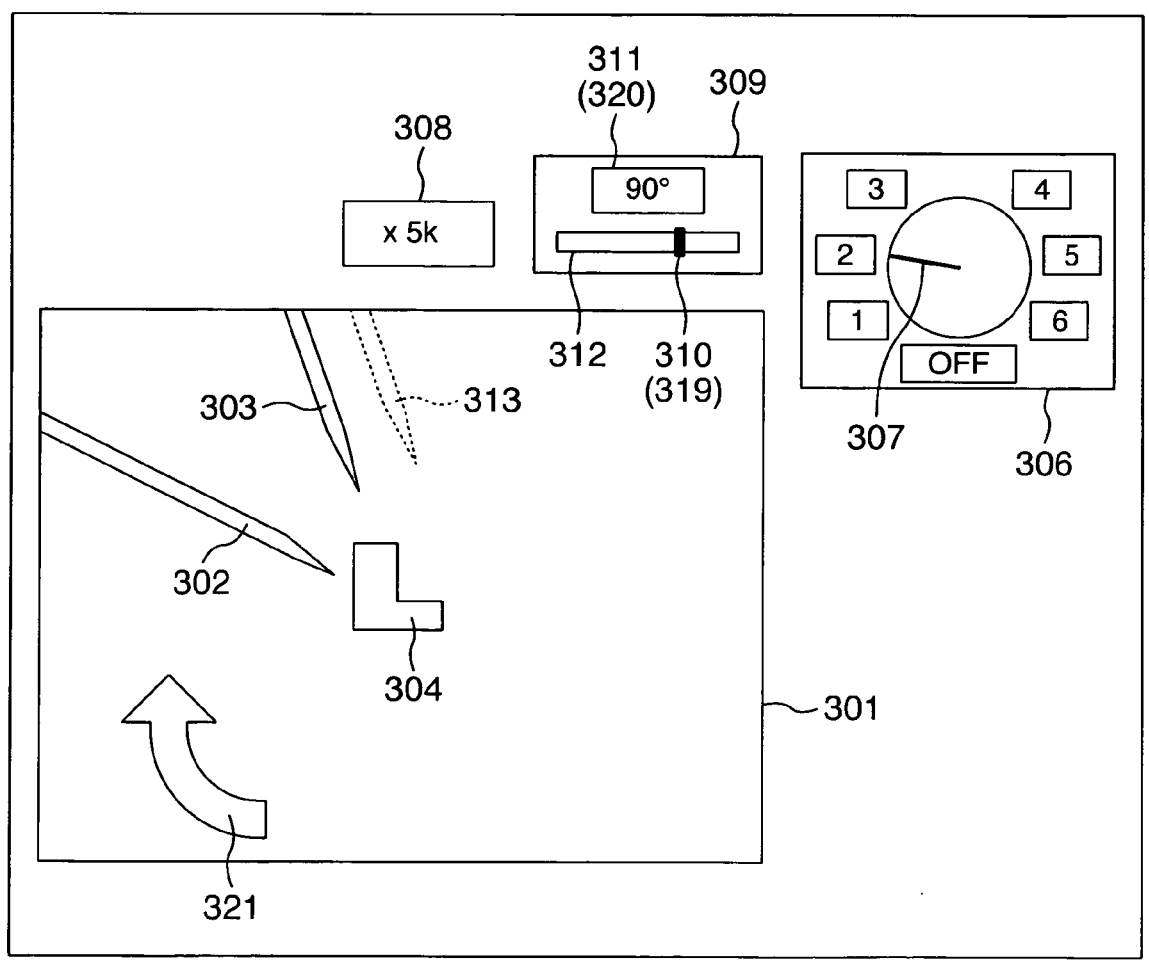

FIG. 3D shows an example of a state of the GUI 301 when the state or FIG. 3C is changed to rotate the display image 90° by use of the display rotation unit. When the user operates the rotation adjust knob GUI field 312 to move the knob to a position of 90° (319 in FIG. 3D), the value of the rotation angle display GUI field 311b is changed to indicate 90° (320 in FIG. 3D). The SEM display screen is also rotated 90° in the direction of the arrow (321). Probe no. 1 302, probe no. 2 303, the probe no. 2 display GUI field 313, and the SEM display object 304 are displayed at respective positions rotated 90°.

As above, there is provided a defect inspecting apparatus including a probe image processing unit to display a plurality of probes on the display unit, a unit to select, from the plural probes displayed on the display unit, a probe to be operated; and a unit to simultaneously display information indicating that the probe thus selected is an operable probe and a non-selected probe at the same time.

Figure 4:
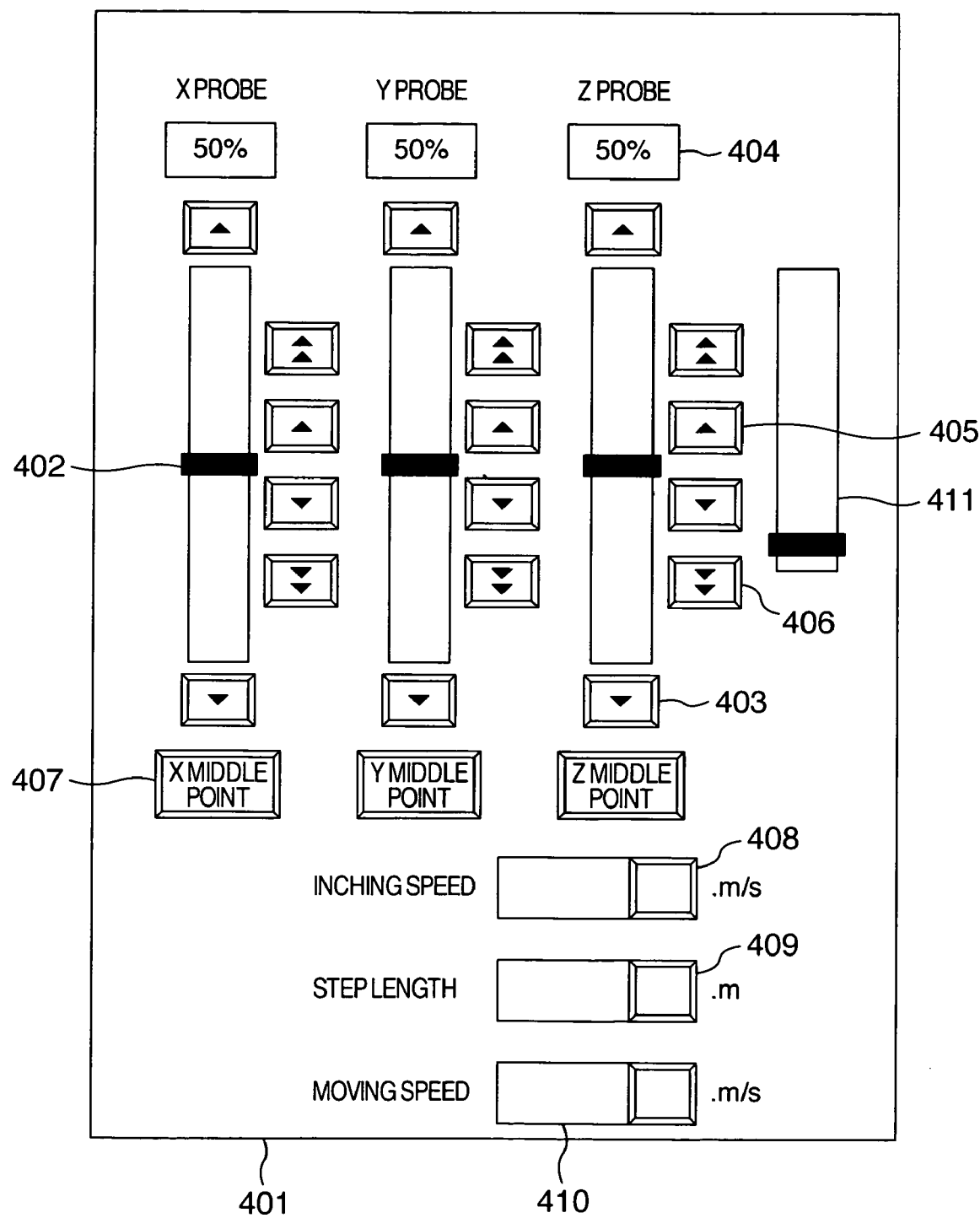
FIG. 4 shows a probe control GUI of the SEM control PC of the defect inspecting apparatus.

FIG. 4 shows a probe control GUI field 401 to control driving of the mechanical probes 106. The field 401 includes an arrow icon 403 similar to a scroll bar 402 to inch the probe in the X, Y, and Z directions using a mouse, a GUI display field 404 to display a quantity of voltage applied to a piezoelectric element to drive the probe, an arrow icon 405 to step-wise move the probe, an arrow icon 406 to continuously move the probe, a reset icon 407 to restore the globe position in the X, Y, Z directions to a central point, a combo box 408 to select a speed to inch the probe in the X, Y, Z directions, a combo box 409 to select a step length to inch the probe in the X, Y, Z directions, and a combo box 410 to select a speed to sequentially move the probe in the X, Y, Z directions. To cautiously bring the probe into contact with an inspection object, the GUI field 401 also includes a Z-directional inching scroll bar 411. The bar 411 is used to display a magnified image of the object at a desired position in a Z-directional inching range, and hence the control operation can be more precisely conducted.

Figure 5:
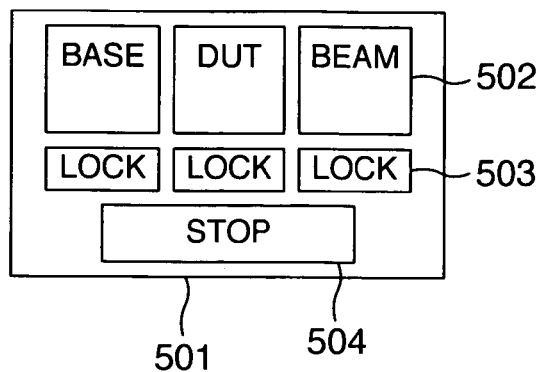
FIG. 5 shows a GUI for a probe stage change of the SEM control PC of the defect inspecting apparatus.

FIG. 5 shows a GUI field 501 to conduct a changeover of control between the base stage, the DUT stage, and the image shift. The field 501 includes icons 502 to conduct selection to respectively move the base stage, the DUT stage, and the image shift; icons 503 to respectively lock the base stage, the DUT stage, and the image shift not to move the selected item, and an icon 504 to stop the control operation of the base stage, the DUT stage, or the image shift under the control operation.

Figure 6:
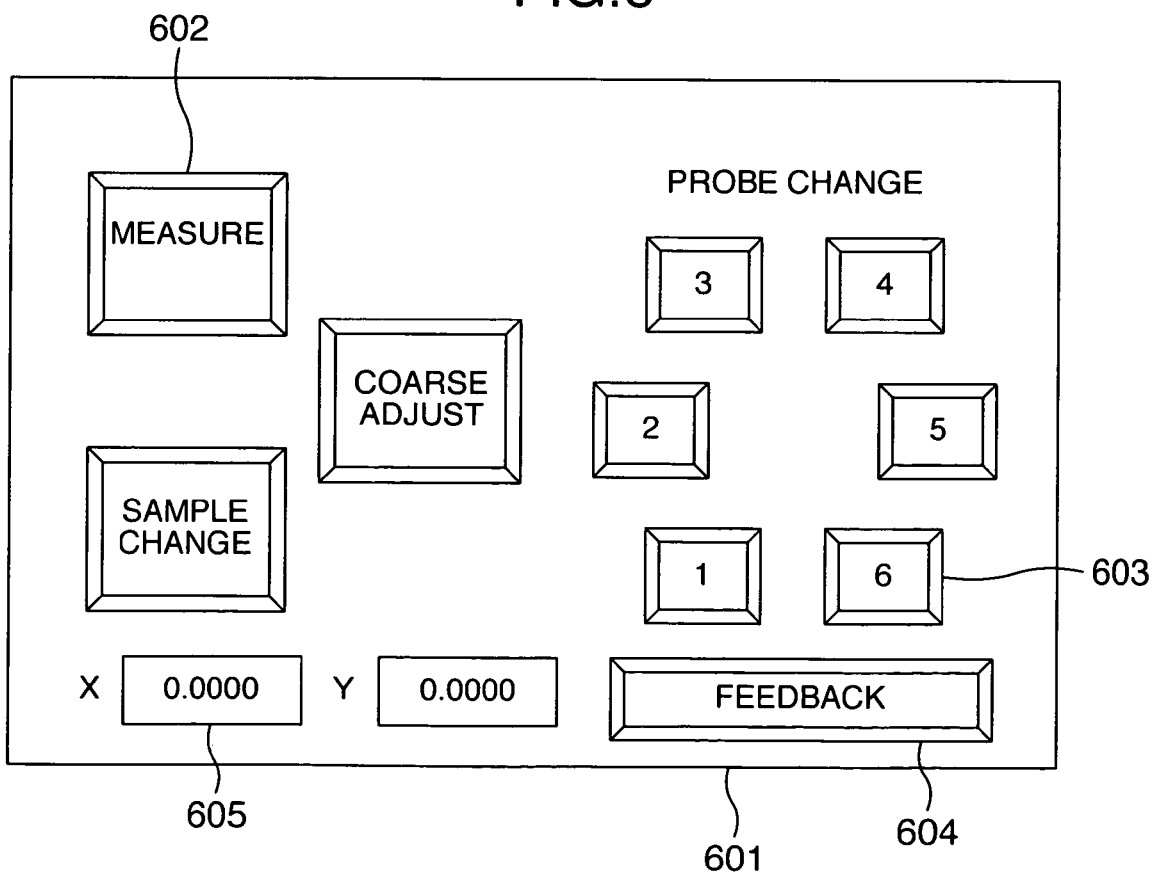
FIG. 6 shows a GUI for a base stage change of the SEM control PC of the defect inspecting apparatus.

FIG. 6 shows a GUI field 601 to control the base stage. The field 601 includes an icon 602 to move the main stage 111 to a sample change position, a measuring position, or a CCD observing position, icons 106 to move, for example, the mechanical globe 106 to a globe change position, an icon 604 to turn a feedback function to remove backlash occurring in the base stage on and off, and a coordinate input•display box 605 to input and to display coordinates of the base stage.

Figure 7:
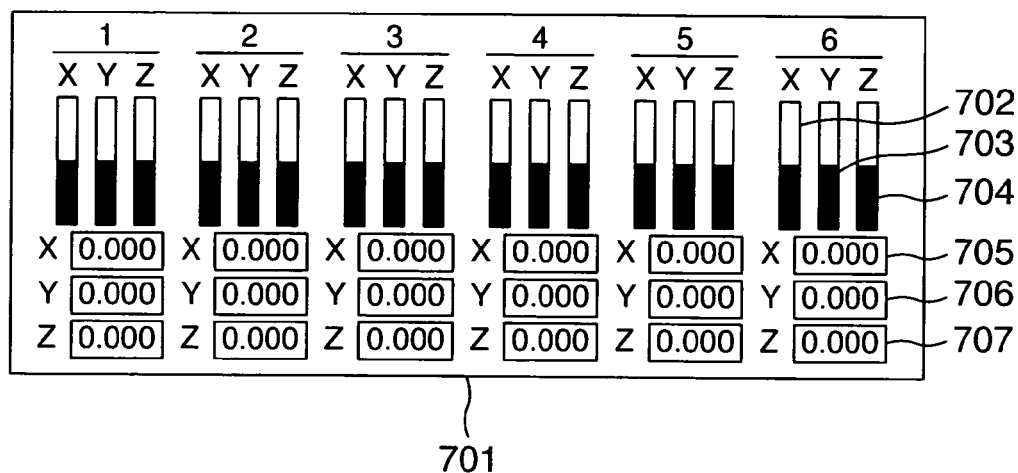
FIG. 7 shows a probe display GUI of the SEM control PC of the defect inspecting apparatus.

FIG. 7 shows a GUI field 701 to display a current position of each probe unit. The probe position display GUI field 701 includes a GUI field 702 to visually indicate a current position in the X direction of an associated probe unit, a GUI field 703 to visually indicate a current position in the Y direction of the probe unit, a GUI field 704 to visually indicate a current position in the Z direction of the probe unit as well as a GUI field 705 to numerically indicate a current position in the X direction of the probe unit, a GUI field 706 to numerically indicate a current position in the Y direction of the probe unit, a GUI field 707 to numerically indicate a current position in the Z direction of the probe unit.

Figure 8:
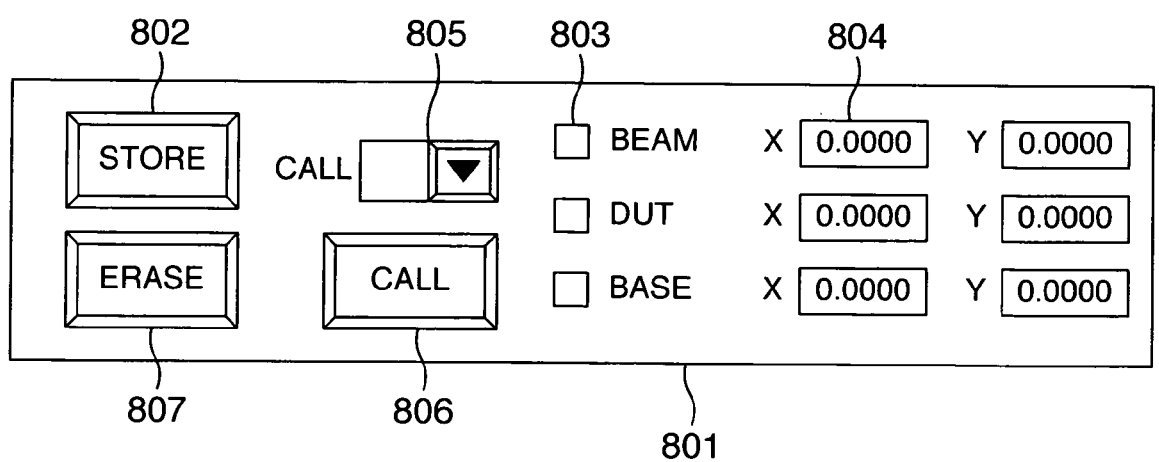
FIG. 8 shows a position information storage GUI of the SEM control PC of the defect inspecting apparatus.

FIG. 8 shows a GUI field 801 to register to a memory the coordinates respectively of the main stage, the DUT stage, and the memory shift to move the probe to a position indicated by information thus registered. The field 801 includes an icon 802 to register to the memory the coordinate values respectively of the main stage, the DUT stage, and the memory shift; check boxes 803 to respectively select information items respectively of the main stage, the DUT stage, and the memory shift; GUI fields 804 each of which displays coordinate information registered and/or called by the operator, a combo box 805 to select and to call the registered coordinates, an icon 806 to move the main stage, the DUT stage, or the memory shift to a position of registered coordinates thus called; and an icon 807 to erase the registered coordinates.

Figure 9A:
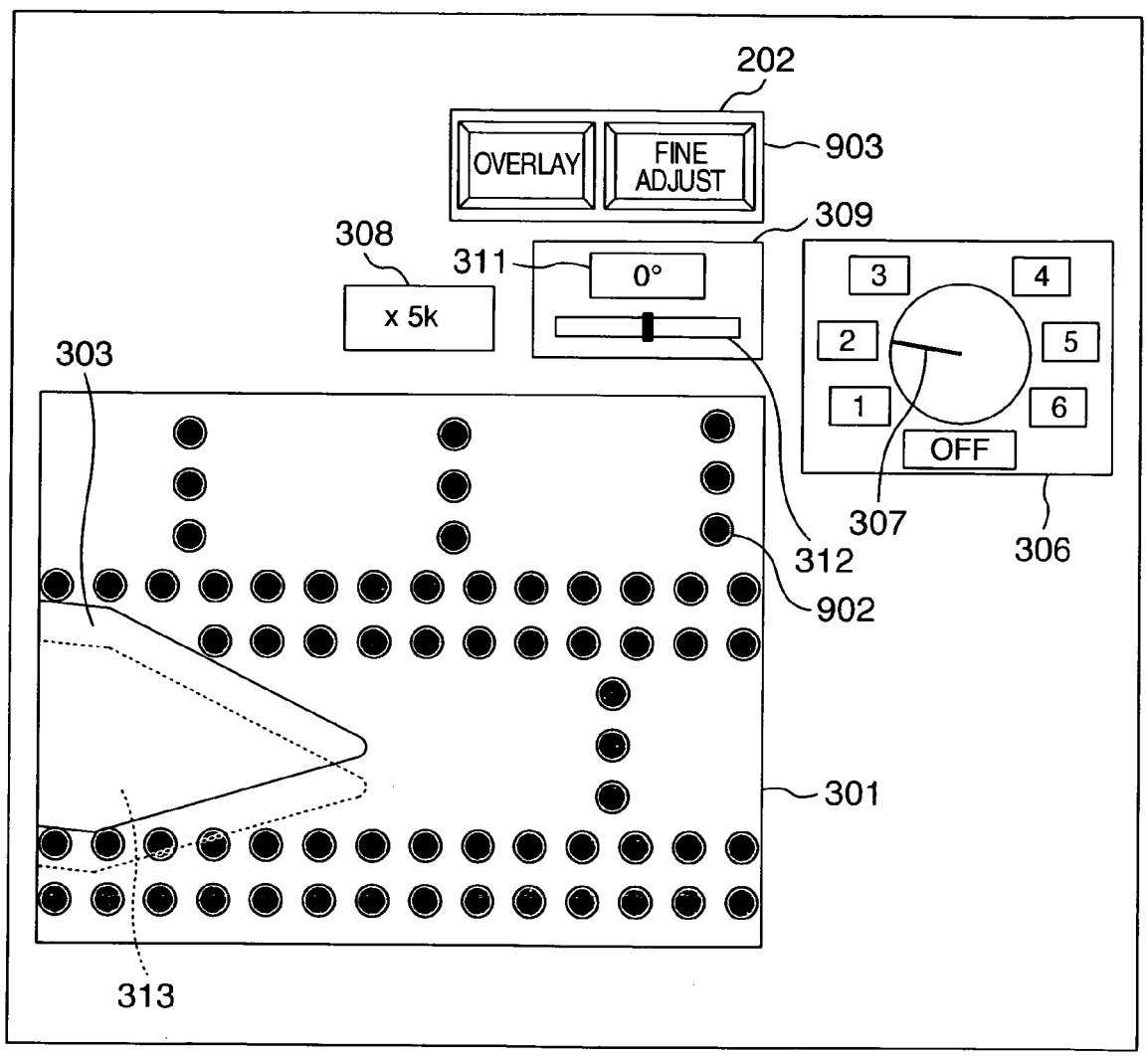
FIGS. 9A–9C show a diagram respectively showing a CAD navigation function GUI of the SEM control PC of the defect inspecting apparatus.
Figure 9B:
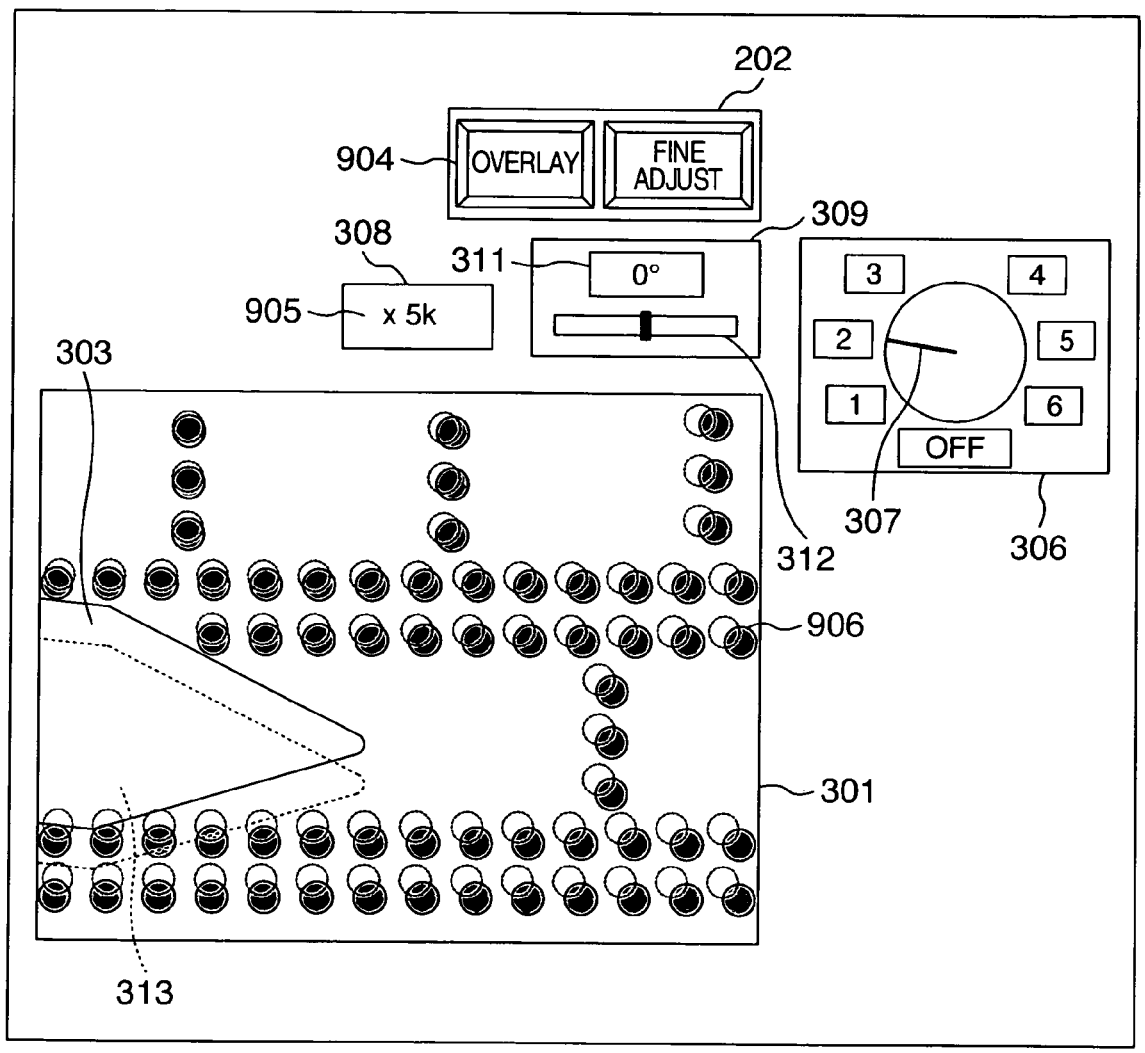
Figure 9C:
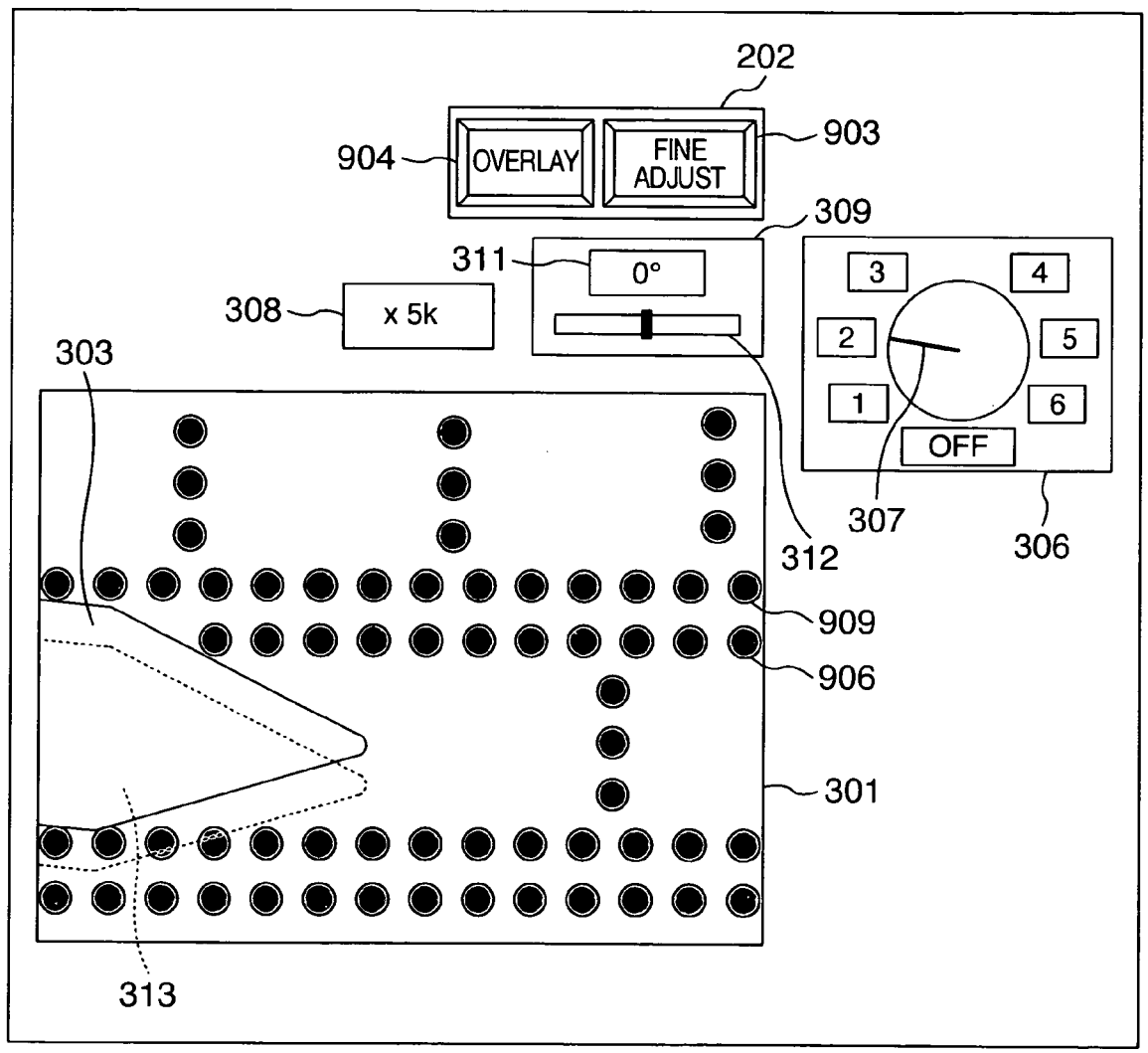

FIGS. 9A to 9C show a GUI field to display (or not to display) CAD navigation information for a sample of a semiconductor device of which a surface has been worked to measure electronic characteristics thereof. As the CAD navigation information, a sample information image created by a sample information image processing unit is displayed. The SEM display screen 301 of FIG. 9A displays plug no. 2 303 selected from a plurality of plugs 902 of the semiconductor device, together with a probe no. 2 display GUI field 313. The SEM control GUI field 202 of FIG. 9A includes a GUI field 903 to designate "display" or "nondisplay" of the CAD navigation information.

FIG. 9B shows a state in which the AD navigation information is displayed. When the user clicks an Overlay GUI field 904, CAD information about a group of plugs 906 is displayed on the SEM display screen 301 as an overlay image with a magnification ratio indicated by the SEM display magnification ratio field 905. When the user clicks the GUI field 904 again in this state, the plug group field 906 is set to a nondisplay state.

FIG. 9C shows a state to combine the CAD navigation information with the SEM display image. When the user clicks the Fine Adjust GUI field 903 in the situation in which the plug group 906 is being displayed on the SEM display screen 301, the device information is again aligned with the CAD information to correct discrepancy between the device plug group 908 of the SEM display and the device plug group 906 of the CAD information in the display image.

Figure 10:
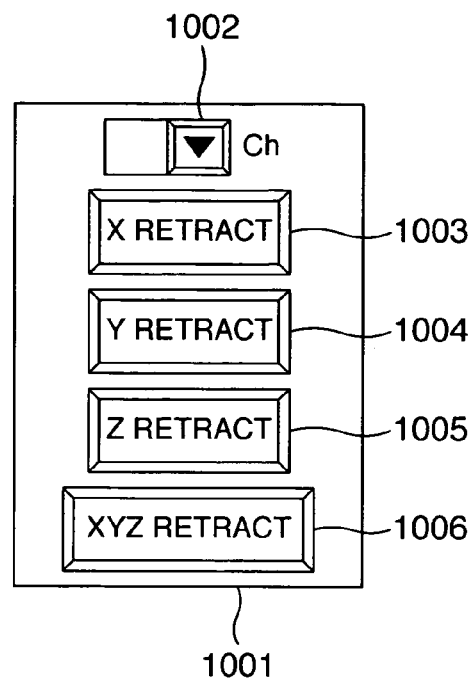
FIG. 10 shows a probe unit retraction GUI of the SEM control PC of the defect inspecting apparatus.

FIG. 10 shows a control GUI field 1001 to retract a probe unit. The probe unit retraction control GUI field 1001 includes a combo box 1002 to select a probe unit as a control object, an icon 1003 to retract the probe unit in the X direction (to a position of an origin in the X direction), an icon 1004 to retract the probe unit in the Y direction (to a position of an origin in the Y direction), and an icon 1005 to retract the probe unit in the Z direction (to a position of an origin in the Z direction); and an icon 1006 to retract the icon in the X, Y, and Z directions (to a positions of an origin in the X, Y, and Z directions). Using the combo box 1002 to select a probe unit, the user can select any possible combination of the probe units.

The defect inspecting apparatus includes a unit to retract a probe unit to an origin of each coordinate axis of the probe unit, a unit to retract a probe unit to a position indicated by the origins respectively of the coordinate axes of the probe unit, and a function to simultaneously retract a plurality of probe units to the positions of the origins respectively of the coordinate axes. The apparatus displays switches to operate the units on the display screen.

Figure 11:
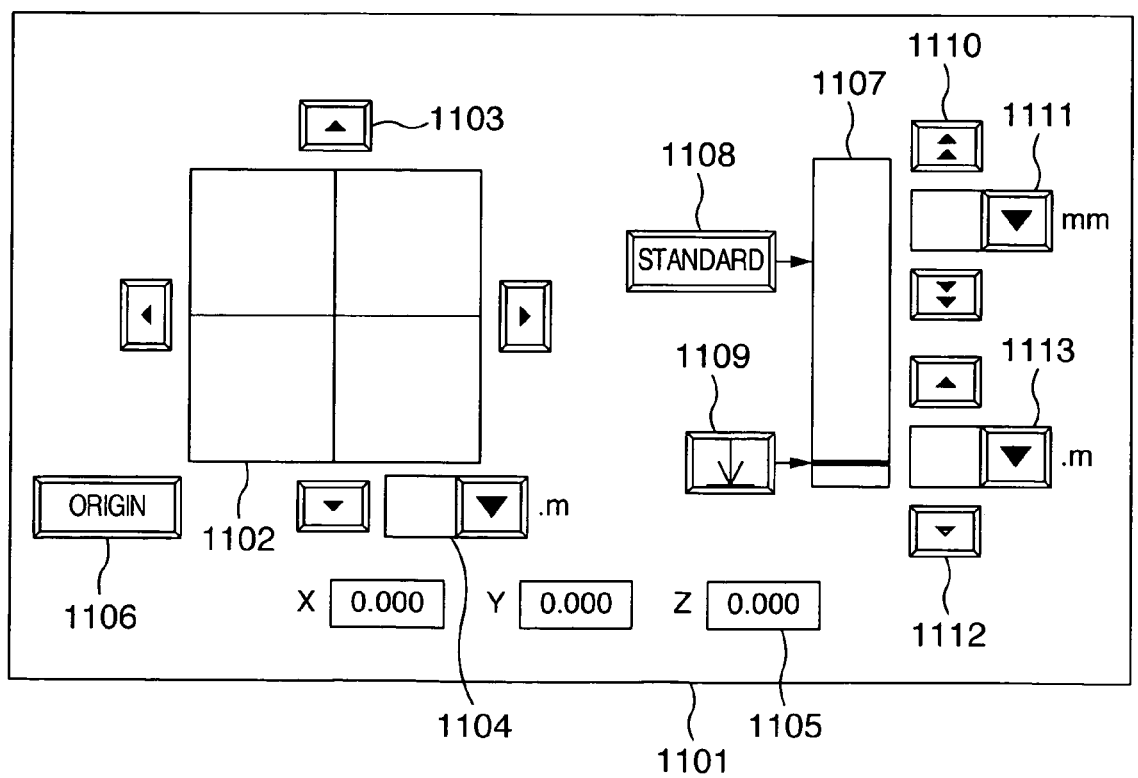
FIG. 11 shows a sample stage control GUI of the SEM control PC of the defect inspecting apparatus.

FIG. 11 shows a sample stage control GUI field 1101 to control the GUT stage. The field 1101 includes a cross cursor 1102 to indicate current positions in the X, Y, and Z directions of the DUT stage, arrow icons 1103 to move the DUT stage in the X, Y, and Z directions, a combo box 1104 to select a length of movement in the X and Y directions of the DUT stage, a coordinate input•display GUI field 1105 to input and to display coordinates in the X, Y, and Z directions of the DUT stage, a reset button 1106 to restore the DUT stage to the origin in the X and Y directions, a GUI field 1107 to indicate a current position in the Z direction of the DUT stage, an icon 1108 to move the DUT stage to a sample measurement standard position in the Z direction, an icon 1109 to move the DUT stage to a lower-most position in the Z direction, an icon 1110 to move the DUT stage a long distance in the Z direction, a combo box 1111 to select the large distance movement in the Z direction, an icon 1112 to inch the DUT stage in the Z direction, and a combo box 1113 to select the inching movement in the Z direction.

Figure 12A:
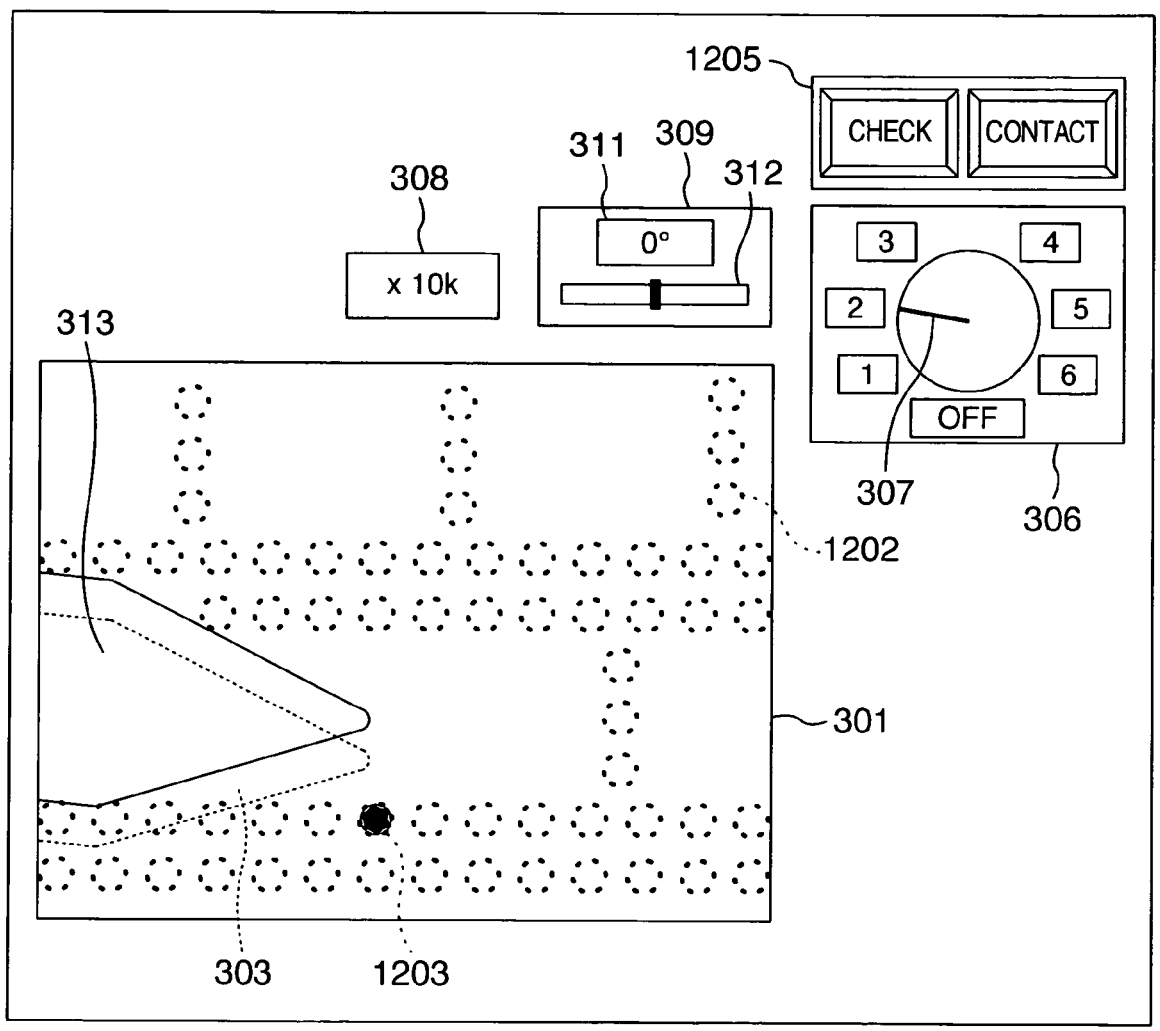
FIGS. 12A–12C show a probe automatic contact control GUI of the SEM control PC of the defect inspecting apparatus.
Figure 12B:
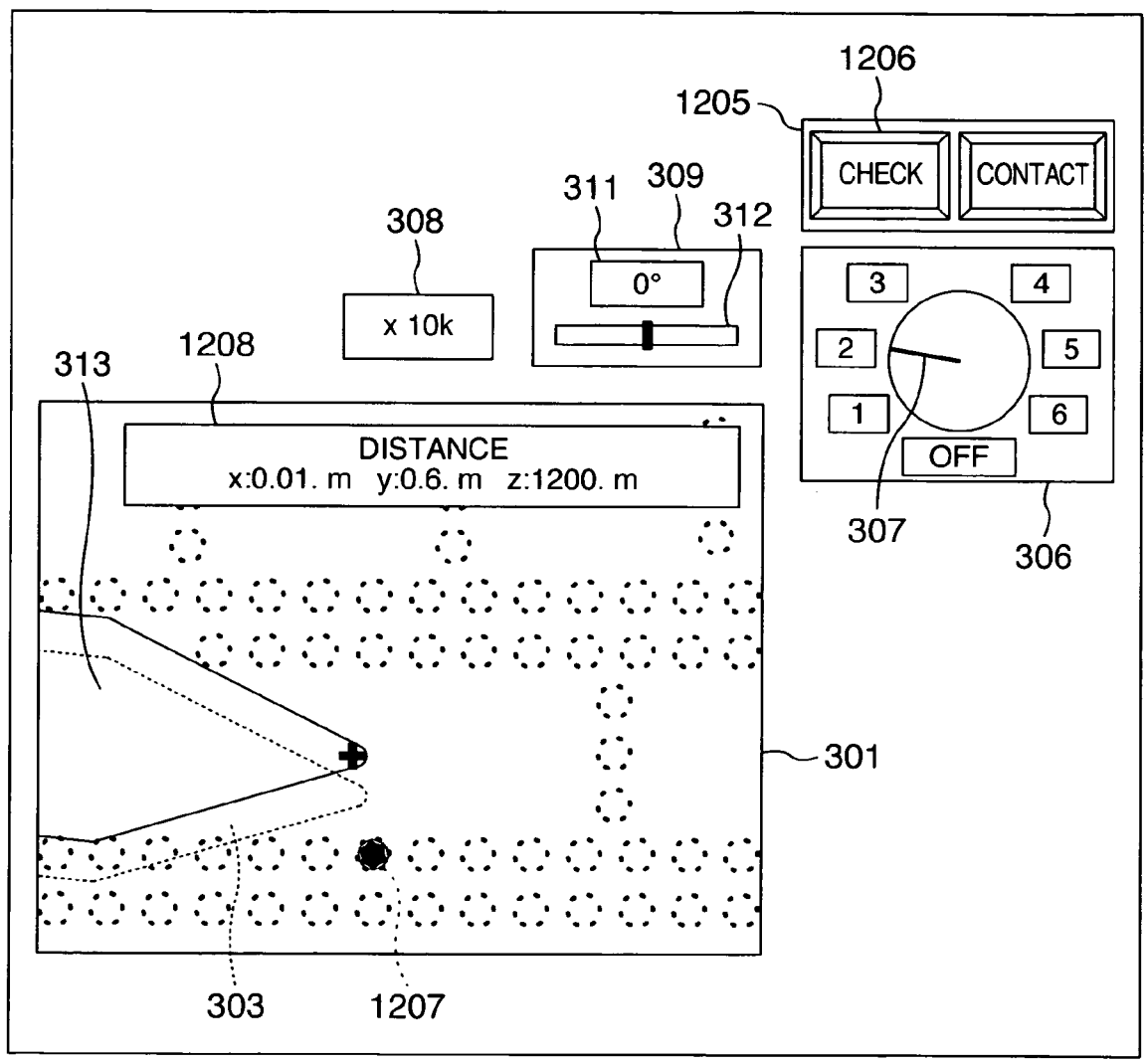
Figure 12C:
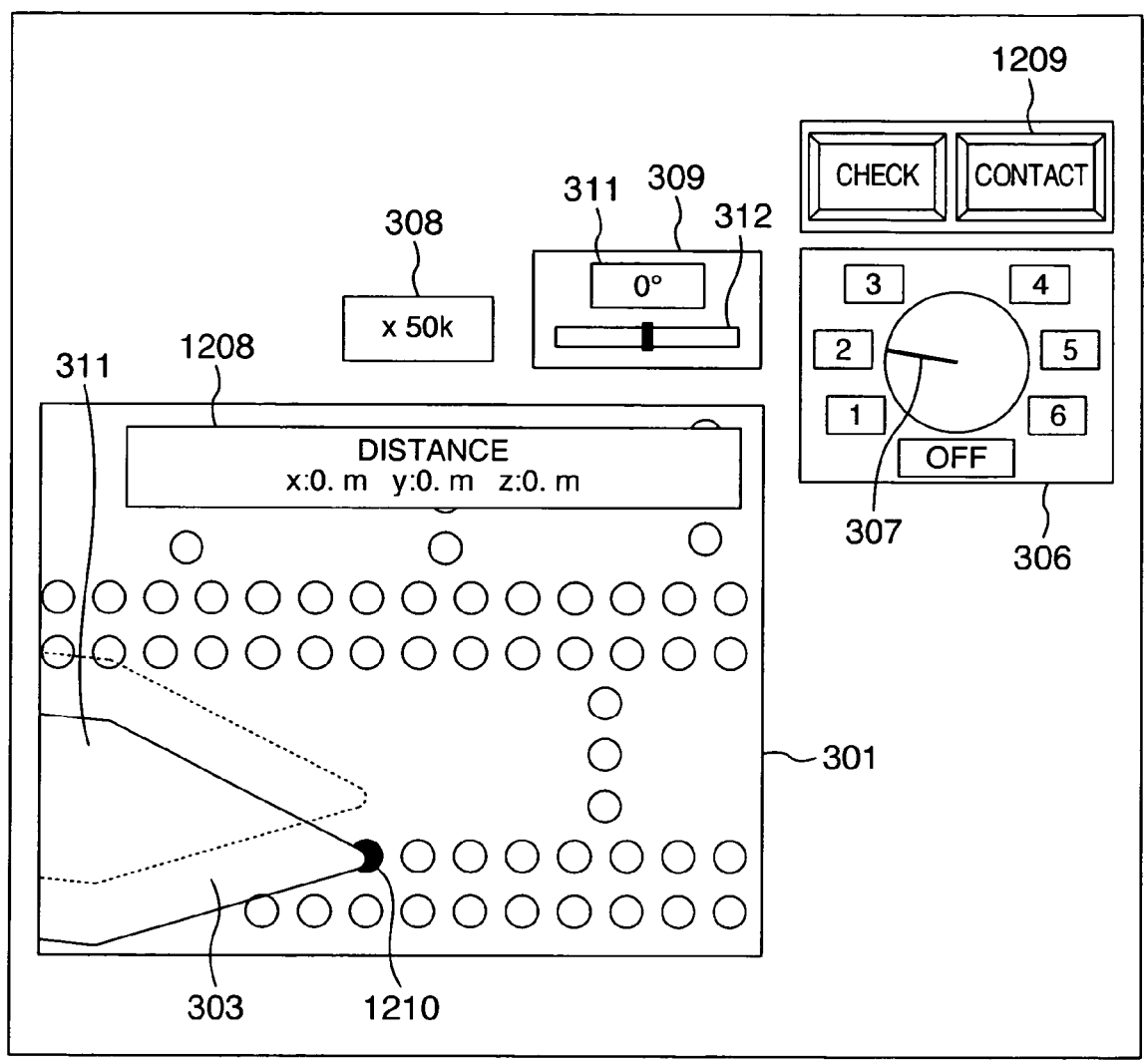

FIGS. 12A to 12C show operation to measure a relative distance between a probe and a target object to automatically bring the probe into contact with the object. The defect inspecting apparatus includes a unit to set a target to a desired section or position of a sample information image and a unit to bring a probe selected for the target as above into contact with the target. The apparatus also includes a unit to calculate distance between a tip end of the probe and the target before the probe is brought into contact with the target and a unit to make the display unit display the distance thus calculated. FIG. 12A shows on the SEM display screen 301 a plurality of plugs 1202 of the semiconductor device, a plug 1203 as a target object, a plug no. 2 probe 303 to be brought into contact with the target, and a control GUI field 1205 to automatically lead contact between the probe and the target object.

FIG. 12B shows a state to process information to lead contact between the probe and the target object. When the user clicks a target object confirmation GUI field 1206 of the control GUI field 1205, a cursor 1207 appears on the SEM display screen 301. The user clicks two positions, i.e., the target object and a tip end of the probe to be brought into contact with the target object. The clicking of the positions may be in an order other than the order described above. The defect inspecting apparatus then executes SEM autofocus and auto-stigma processing, displays distance between the two points on the screen and a relative distance between the two clicked positions using SEM work distance in three dimensions x, y, and z; displays on the SEM display screen distances in the x, y, and z directions indicated in the relative distance display GUI field 1208, and stores the information in a memory of the control PC.

FIG. 12C shows a state to automatically lead contact between a probe and a target object. When the user clicks an automatic probe contact GUI field 1209, the defect inspecting apparatus controls the probe according to the information obtained through the operation shown in FIG. 12B to bring the probe into contact (1210) with the target. In the situation, to secure the contact between the probe and the target, the operation may be carried out by conducting self-correction of the information using an image processing technique.

As above, the defect inspecting apparatus of the embodiment includes a unit to display probes on an obtained image together with information indicating that the probes are in the controllable state.

The apparatus also includes a unit to make the probe display follow a rotation of the display screen by the rotation function and a unit to magnify or to minimize, in response to a change in the display magnification ratio of the electrooptical system, the contour of the probe display according to the display magnification ratio.

The defect inspecting apparatus can display an instruction to the probe unit moving unit on the display screen.

The apparatus can display on and can conceal from the display screen a display screen to select an operation range for the probe unit moving.

The apparatus also includes a changeover switch to change a control state of the probe unit and can display the changeover switch on the display screen.

The defect inspecting apparatus includes a changeover switch to change a control state of the sample stage, the base stage, and the charged-particle beam and can display the changeover switch on the display screen.

The apparatus includes, for a method of aligning the base stage, selection switches to move the sample respectively to the electric characteristic measuring position, the sample change position, and the probe holder change position and can display the switches on the display screen.

The apparatus can display, for the selection switches on the display screen, the position and the state of the base stage selected by the user in mutually different colors. This makes the user visually confirm the current position and state of the base stage.

The defect inspecting apparatus includes a unit to visually and numerically display positions of the plural probe units on the display screen.

The apparatus includes a storage unit to store positional information of the sample stage, the base stage, and the charged-particle beam; a unit to display the information on the display screen, and a selection switch to move the positions of the sample stage, the base stage, and the charged-particle beam. The apparatus includes the selection switch on the display screen.

The apparatus can display the obtained image and the sample information on the display screen. The apparatus can display the image and the information in an overlay image. The apparatus can display a display·nondisplay changeover switch for the display of the image and the information. The apparatus can display the changeover switch on the display screen.

The defect inspecting apparatus includes a unit to retract a probe unit to an origin of each of the coordinate axes of the probe unit, a unit to retract a probe unit to an origin of the coordinate axes of the probe unit, and a unit to retract a plurality of probe units to the units to origins respectively of the coordinate axes of the probe units. The apparatus can display switches to operate these units on the display screen.

The apparatus includes a unit to move the sample stage according to sample information to display a desired position of the sample information and a unit to move, in association therewith, the probe unit to move a probe to the desired position of the sample information.

The defect inspecting apparatus includes a unit to automatically bring the probe attached to the probe unit into contact with a target object on the sample by use of an autofocus unit and an auto-stigma unit.

The apparatus also includes a function to retract the sample stage in a direction to apart from the probe and a function to move or to inch the sample stage a fine length such that the sample approaches the probe or removes from the probe. The apparatus can display switches to conduct these functions.

For a defect inspecting apparatus in which probes are combined with a charged-particle beam unit, it is proposed that graphic user interfaces (GUI) to control a plurality of probes disposed in a complex arrangement are disposed on the screen in which the SEM image display screen is displayed. According to the present invention, operability and usability of the apparatus are remarkably increased to control the charged-particle beam unit.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A defect inspecting apparatus, comprising:
   a charged-particle source;
   an emitting unit that emits a charged-particle beam from the charged-particle source onto a sample;
   an image shift unit that moves a point on the sample of the charged-particle beam, the beam being emitted onto the point;
   an image obtaining unit that detects a beam of secondary charged particles appearing due to the charged-particle beam emitted onto the sample and for obtaining an image of the sample;
   a display unit that displays the image obtained in the preceding step;
   a storage unit having stored information about the sample;
   an image processing unit that executes image processing on the image to display the image;
   an electrooptical unit including a communication unit to connect the storage unit to the image processing unit;
   a sample stage that mounts the sample thereon;
   a sample chamber including the sample stage therein;

a sample change chamber connected to the sample chamber to temporarily keep the sample therein;

a first transporting unit that transports the sample between the sample change chamber and the sample chamber;

a probe holder including a plurality of probes which are brought into contact with the sample to measure electric characteristics of the sample;

a plurality of probe units that moves the probe holder;

a probe holder change chamber that temporarily keeps the probe holder therein;

a second transporting unit connected to the sample chamber for transporting the probe holder between the probe holder change chamber and the sample chamber;

a base stage that transports the sample and the probe units to a position at which the sample and each of the probe units can be changed;

a probe image processing unit that displays the plural probes on the display unit;

a probe selecting unit that selects, from the plural probes displayed on the display unit, a probe to be operated; and a probe display unit that simultaneously displays thereon that the probe selected by the probe selecting unit is a probe which can be operated and that the probe is a probe in a non-selection state in which the probe is not selected.

2. A defect inspecting apparatus according to claim 1, further comprising a probe driving unit that moves the probe holder, wherein the sample stage, the probe holder, and the probe driving unit are mounted on the base stage to thereby move the sample and the probes in an independent manner and at the same time.

3. A defect inspecting apparatus according to claim 1, wherein:

an image obtained by the image processing unit and the plural images of probes are displayed on the display unit by the probe image processing unit at the same time; and a probe to be moved toward or retracted from the image obtained by the image processing unit is selected from the plural probes by the probe selecting unit.

4. A defect inspecting apparatus according to claim 1, further comprising a sample information image processing unit that displays information of the sample as an image on the display unit, wherein:

the image of the information of the sample and the plural images of probes are displayed on the display unit by the probe image processing unit at the same time; and a probe to be moved toward or retracted from the image of the information of the sample is selected from the plural probes by the probe selecting unit.

5. A defect inspecting apparatus according to claim 3, further comprising:

a target setting unit that sets a target to a desired position of the sample information image; and a probe contact unit that brings the probe selected by the probe selecting unit into contact with the target.

6. A defect inspecting apparatus according to claim 4, further comprising:

a distance calculating unit that calculates, in the operation to bring the probe into contact with the target, distance between a tip end of the probe and the target before the probe is brought into contact with the target; and a distance display unit that displays the distance calculated by the distance calculating unit on the display unit.

7. A defect inspecting apparatus according to claim 1, further comprising:

a sample information image processing unit that displays information of the sample as an image on the display unit, wherein the obtained image obtained by the image obtaining unit and the image of the information of the sample are displayed on the display unit in an overlapped manner.

8. A defect inspecting apparatus according to claim 1, further comprising:

a first retracting unit that retracts, for each of coordinate axes of the probe unit, the probe unit to a position of an origin the coordinate axis;

a second retracting unit that retracts the probe unit to a position of an origin of each of coordinate axes of the probe unit; and a third retracting unit that retracts a plurality of probe units to positions of origins of coordinate axes respectively of the probe units, wherein a switch to operate the first, second, and third retracting units on the display screen.

9. A defect inspecting apparatus according to claim 1, further comprising a display rotating unit that rotates a display image on the display unit displaying the plural probes and the selected probes selected by the probe selecting unit.

10. A defect inspecting apparatus according to claim 1, further comprising a selected probe display unit that controls the display unit so as to display the probe selecting unit.

11. A defect inspecting apparatus, comprising:

an emitting module that emits a charged-particle beam from a charged-particle source onto a sample;

an image shift module that moves a point on the sample of the charged-particle beam, the beam being emitted onto the point;

a detecting module that detects a beam of secondary charged particles appearing due to emission of the charged-particle beam onto the sample;

an image creating module that generates an image associated with the sample according to the secondary charged-particle beam detected by the detecting unit;

a plurality of movable probes which can make contact with the sample;

a probe selecting module that selects, from the plural probes, a probe to be brought into contact with the sample; and a display screen that displays the image which is associated with the sample and which is created by the image creating module, and the image associated with the probe selected by the probe selecting unit and the other of the plurality of movable probes together with information indicating that the probe selected by the probe selecting unit is displayed separately from the other of the plurality of movable probes.

12. The defect inspecting apparatus according to claim 11, further comprising a probe driving module that moves a probe selected by the probe selecting module in such a manner that the probe and the sample independently move at the same time.

13. The defect inspecting apparatus according to claim 11, wherein:

an image obtained by the image creating module and the plural images of probes are displayed on the display screen by the probe image creating module at the same time; and a probe to be moved toward or retracted from the image obtained by the image creating module is selected from the plural probes by the probe selecting module.

14. The defect inspecting apparatus according to claim 11, further comprising a sample information image processing module that displays information of the sample as an image on the display unit, wherein:
the image of the information of the sample and the plural images of probes are displayed on the display screen by the probe image creating module at the same time; and
a probe to be moved toward or retracted from the image of the information of the sample is selected from the plural probes by the probe selecting module.

15. The defect inspecting apparatus according to claim 13, further comprising:
a target setting module that sets a target to a desired position of the sample information image; and
a probe contact module that brings the probe selected by the probe selecting module into contact with the target.

16. A defect inspecting apparatus, comprising:
an emitting module that emits a charged-particle beam from a charged-particle source onto a sample;
an image shift module that moves a point on the sample of the charged-particle beam, the beam being emitted onto the point;
a detecting module that detects a beam of secondary charged particles appearing due to emission of the charged-particle beam onto the sample;
an image creating module that generates an image associated with the sample according to the secondary charged-particle beam detected by the detecting unit;
a plurality of movable probes which can make contact with the sample;
a probe selecting module that selects, from the plural probes, a probe to be brought into contact with the sample; and
a display screen that displays the image which is associated with the sample and which is created by the image creating module, and the image associated with the probe selected by the probe selecting unit together with information indicating that the probe selected by the probe selecting unit is operable; further comprising
a sample information image processing module that displays information of the sample as an image on the display unit, wherein:
the image of the information of the sample and the plural images of probes are displayed on the display screen by the probe image creating module at the same time; and
a probe to be moved toward or retracted from the image of the information of the sample is selected from the plural probes by the probe selecting module; and
a distance calculating module that calculates, in the operation to bring the probe into contact with the target, distance between a tip end of the probe and the target before the probe is brought into contact with the target; and a distance display screen that displays the distance calculated by the distance calculating module on the display screen.

17. The defect inspecting apparatus according to claim 11, further comprising:
a sample information image processing module that displays information of the sample as an image on the display screen, wherein
the obtained image obtained by both the image creating and the image of the information of the sample are displayed on the display unit in an overlapped manner.

18. A defect inspecting apparatus, comprising:
an emitting module that emits a charged-particle beam from a charged-particle source onto a sample;
an image shift module that moves a point on the sample of the charged-particle beam, the beam being emitted onto the point;
a detecting module that detects a beam of secondary charged particles appearing due to emission of the charged-particle beam onto the sample;
an image creating module that generates an image associated with the sample according to the secondary charged-particle beam detected by the detecting unit;
a plurality of movable probes which can make contact with the sample;
a probe selecting module that selects, from the plural probes, a probe to be brought into contact with the sample; and
a display screen that displays the image which is associated with the sample and which is created by the image creating module, and the image associated with the probe selected by the probe selecting unit together with information indicating that the probe selected by the probe selecting unit is operable; further comprising:
a first retracting unit that retracts, for each of coordinate axes of a probe selected by the probe selecting module to a position of an origin the coordinate axis;
a second retracting unit that retracts the probe to a position of an origin of each of coordinate axes of the probe; and
a third retracting unit that retracts a plurality of probes to positions of origins of coordinate axes respectively of each of the probes, wherein
a switch to operate the first, second, and third retracting units on the display screen.

19. The defect inspecting apparatus according to claim 11, further comprising a display rotating unit that rotates a display image on the display screen displaying the plural probes and the selected probes selected by the probe selecting module.

20. The defect inspecting apparatus according to claim 11, further comprising a selected probe display module that controls the display screen so as to display the probe selecting module.

* * * * *